(12) United States Patent
Won et al.

(10) Patent No.: US 11,910,499 B2
(45) Date of Patent: Feb. 20, 2024

(54) ELECTRONIC APPARATUS AND CONTROL METHOD THEREOF

(71) Applicant: SAMSUNG ELECTRONICS CO., LTD., Suwon-si (KR)

(72) Inventors: Junhyun Won, Suwon-si (KR); Jiwon Lee, Suwon-si (KR); Sungyong Joo, Suwon-si (KR); Taejun You, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 213 days.

(21) Appl. No.: 17/575,281

(22) Filed: Jan. 13, 2022

(65) Prior Publication Data

US 2022/0338319 A1 Oct. 20, 2022

Related U.S. Application Data

(63) Continuation of application No. PCT/KR2021/019949, filed on Dec. 27, 2021.

(30) Foreign Application Priority Data

Apr. 19, 2021 (KR) .................... 10-2021-0050499

(51) Int. Cl.
  *H05B 45/10* (2020.01)
  *H05B 45/30* (2020.01)
  *H01L 27/15* (2006.01)
(52) U.S. Cl.
  CPC .......... *H05B 45/10* (2020.01); *H01L 27/153* (2013.01); *H05B 45/30* (2020.01)
(58) Field of Classification Search
  CPC ........ H01L 27/153; H05B 45/10; H05B 45/30
  (Continued)

(56) References Cited

U.S. PATENT DOCUMENTS 7,919,936 B2   4/2011   Liu et al.
9,013,188 B2   4/2015   Nam
(Continued)

FOREIGN PATENT DOCUMENTS

JP    6171724       8/2017
KR    20-0307889    3/2003
(Continued)

OTHER PUBLICATIONS

Search Report and Written Opinion dated Apr. 21, 2022 in counterpart International Patent Application No. PCT/KR2021/019949.

*Primary Examiner* — William Hernandez
(74) *Attorney, Agent, or Firm* — Nixon & Vanderhye, P.C.

(57) ABSTRACT

An electronic apparatus is provided. The electronic apparatus includes: a plurality of LED arrays disposed in parallel, a first sensing inductor connected to a first LED array of the plurality of LED arrays in series, a first auxiliary inductor disposed adjacent to the first sensing inductor, a second sensing inductor connected to a second LED array of the plurality of LED arrays in series, a second auxiliary inductor disposed adjacent to the second sensing inductor, a variable resistance connected to the plurality of LED arrays and configured to adjust an amount of a current flowing to the plurality of LED arrays according to a resistance value, and an LED driver configured to, based on at least one of a first induced voltage generated on the first auxiliary inductor or a second induced voltage generated in the second auxiliary inductor being a threshold voltage or more, identify that an error occurs in at least one of the first LED array or the second LED array, and adjust the resistance value of the variable resistance based on the identified result.

20 Claims, 12 Drawing Sheets

(58) Field of Classification Search
USPC .................................................. 315/130, 131
See application file for complete search history.

(56) References Cited

U.S. PATENT DOCUMENTS

| | | | |
|---|---|---|---|
| 9,794,993 B2 | 10/2017 | Lee | |
| 9,860,955 B2 | 1/2018 | Kim et al. | |
| 9,961,742 B2 | 5/2018 | Ahn et al. | |
| 10,117,304 B2 | 10/2018 | Huang et al. | |
| 10,834,794 B2 | 11/2020 | Jo et al. | |
| 10,971,057 B2 | 4/2021 | Jung et al. | |
| 2009/0295776 A1* | 12/2009 | Yu .......................... | H05B 45/46 345/212 |
| 2010/0156324 A1* | 6/2010 | Nagase .................. | H05B 45/54 315/307 |
| 2016/0323949 A1 | 11/2016 | Lee | |
| 2017/0064785 A1 | 3/2017 | Kim et al. | |
| 2020/0118482 A1 | 4/2020 | Jung et al. | |
| 2020/0146125 A1 | 5/2020 | Jo et al. | |

FOREIGN PATENT DOCUMENTS

| | | |
|---|---|---|
| KR | 10-2010-0017050 | 2/2010 |
| KR | 10-1005199 | 12/2010 |
| KR | 10-2012-0083005 | 7/2012 |
| KR | 10-2013-0116126 | 10/2013 |
| KR | 10-1410551 | 6/2014 |
| KR | 10-2016-0130095 | 11/2016 |
| KR | 10-1683876 | 12/2016 |
| KR | 10-2017-0027906 | 3/2017 |
| KR | 10-2019-0010261 | 1/2019 |
| KR | 10-1967950 | 4/2019 |
| KR | 10-2020-0042809 | 4/2020 |

* cited by examiner

ELECTRONIC APPARATUS AND CONTROL METHOD THEREOF

CROSS-REFERENCE TO RELATED APPLICATIONS

This application is a continuation of International Application No. PCT/KR2021/019949 designating the United States, filed on Dec. 27, 2021, in the Korean Intellectual Property Receiving Office and claiming priority to Korean Patent Application No. 10-2021-0050499, filed on Apr. 19, 2021, in the Korean Intellectual Property Office, the disclosures of which are incorporated by reference herein in their entireties.

BACKGROUND

Field

The disclosure relates to an electronic apparatus and a control method thereof and to an electronic apparatus including a plurality of LED elements and a control method thereof.

Description of Related Art

Recently, display apparatuses including a plurality of LED elements have been developed and popularized along with an increase in size of display apparatuses and providing of high-luminance contents.

The plurality of LED elements may be connected in serial or in parallel, and particularly, in a case where the plurality of LED elements are connected in parallel, if a specific LED element is broken, there is a problem that an overcurrent flows to the remaining LED elements due to characteristic of parallel connection.

Referring to FIG. 1, if any one of a plurality of LED elements connected in parallel is broken, there is problem that an overcurrent flows to the remaining LED elements and the remaining LED element also has high probability of being broken due to the overcurrent.

In the related art, in order to prevent flowing of the overcurrent to the remaining LED elements except for the broken LED element, a variable resistance is connected to the LED element in series to adjust a resistance value of the resistance and adjust a size of the current.

However, such a method may cause power loss generated due to the resistance and heat generation.

Accordingly, there is an increasing need for a method for minimizing power loss due to resistance and generation of heat while preventing a problem that the overcurrent flows to the remaining LED element, although the LED element is broken.

SUMMARY

Embodiments of the disclosure provide an electronic apparatus which prevents and/or reduces overcurrent when an error of an LED array occurs while minimizing and/or reducing power loss and heat generation, and a control method thereof.

In accordance with an example embodiment, there is provided an electronic apparatus including: a plurality of light emitting diode (LED) arrays disposed in parallel, a first sensing inductor connected to a first LED array of the plurality of LED arrays in series, a first auxiliary inductor disposed adjacent to the first sensing inductor, a second sensing inductor connected to a second LED array of the plurality of LED arrays in series, a second auxiliary inductor disposed adjacent to the second sensing inductor, a variable resistance connected to the plurality of LED arrays and configured to adjust an amount of a current flowing to the plurality of LED arrays according to a resistance value, and an LED driver configured to, based on at least one of a first induced voltage generated on the first auxiliary inductor or a second induced voltage generated on the second auxiliary inductor being a threshold voltage or more, identify that an error occurs in at least one of the first LED array or the second LED array, and adjust the resistance value of the variable resistance based on the identified result.

The LED driver may be configured to, based on the identification that an error occurs in at least one of the first LED array or the second LED array, increase the resistance value of the variable resistance.

The first sensing inductor and the second sensing inductor may include primary coils, each of the first auxiliary inductor and the second auxiliary inductor may be a secondary coil disposed adjacent to the corresponding primary coil, a threshold voltage corresponding to the first induced voltage may be determined based on a turns ratio of the number of turns of the first sensing inductor to the number of turns of the first auxiliary inductor, and a threshold voltage corresponding to the second induced voltage may be determined based on a turns ratio of the number of turns of the second sensing inductor to the number of turns of the second auxiliary inductor.

The LED driver may be configured to, based on the identification that an error occurs in any one of the first LED array or the second LED array, adjust a voltage applied to another one of the first LED array or the second LED array to be less than the threshold voltage by increasing the resistance value of the variable resistance.

The LED driver may be configured to, based on the identification that an error occurs in any one of the first LED array or the second LED array based on the identified result, convert a power supply mode for another one of the first LED array or the second LED array from a quasi-resonant (QR) mode to a continuous current mode (CCM).

The LED driver may be configured to increase a duty ratio of a pulse width modulation (PWM) current applied to the other one of the first LED array or the second LED array in the CCM mode.

The electronic apparatus may further include: a first switch disposed between the first LED array and the first sensing inductor, a second switch disposed between the second LED array and the second sensing inductor, and a third switch disposed between the first sensing inductor and the second sensing inductor, and the LED driver may be configured to, based on the identification that an error occurs in the first LED array based on the identified result, connect the first sensing inductor, the second sensing inductor, and the second LED array in series by controlling the first switch and the third switch, and based on the identification that an error occurs in the second LED array based on the identified result, connect the first sensing inductor, the second sensing inductor, and the first LED array in series by controlling the second switch and the third switch.

A plurality of first LEDs included in the first LED array and a plurality of second LEDs included in the second LED array are disposed alternately.

The plurality of LED arrays, the sensing inductor and the auxiliary inductor corresponding to each of the plurality of LED arrays, and the variable resistance are included in an LED circuit, and a resistance value of the LED circuit is adjusted according to the adjustment of the resistance value of the variable resistance.

The LED driver may be configured to identify the number of LED arrays in which an error occurs among the plurality of LED arrays, and adjust the resistance value of the variable resistance to correspond to the identified number.

In accordance with an example embodiment, there is provided a method for controlling an electronic apparatus including a plurality of LED arrays disposed in parallel, a first sensing inductor connected to a first LED array of the plurality of LED arrays in series, and a second sensing inductor connected to a second LED array in series, the method including: based on at least one of a first induced voltage generated on a first auxiliary inductor disposed adjacent to the first sensing inductor or a second induced voltage generated on a second auxiliary inductor disposed adjacent to the second sensing inductor being a threshold voltage or more, identifying that an error occurs in at least one of the first LED array or the second LED array, adjusting a resistance value of a variable resistance connected to the plurality of LED arrays and, adjusting an amount of a current flowing to the plurality of LED arrays according to the resistance value based on the identified result.

The adjusting may include, based on the identification that an error occurs in at least one of the first LED array or the second LED array, increasing the resistance value of the variable resistance.

The first sensing inductor and the second sensing inductor may include primary coils, each of the first auxiliary inductor and the second auxiliary inductor may be a secondary coil disposed adjacent to the corresponding primary coil, a threshold voltage corresponding to the first induced voltage may be determined based on a turns ratio of the number of turns of the first sensing inductor to the number of turns of the first auxiliary inductor, and a threshold voltage corresponding to the second induced voltage may be determined based on a turns ratio of the number of turns of the second sensing inductor to the number of turns of the second auxiliary inductor.

The adjusting may include, based on the identification that an error occurs in any one of the first LED array or the second LED array, adjusting a voltage applied to another one of the first LED array or the second LED array to be less than the threshold voltage by increasing the resistance value of the variable resistance.

The method may further include, based on the identification that an error occurs in any one of the first LED array or the second LED array based on the identified result, converting a power supply mode for the other one of the first LED array or the second LED array from a quasi-resonant (QR) mode to a continuous current mode (CCM).

The method may further include increasing a duty ratio of a pulse width modulation (PWM) current applied to the other one of the first LED array or the second LED array in the CCM mode.

The electronic apparatus may further include: a first switch disposed between the first LED array and the first sensing inductor, a second switch disposed between the second LED array and the second sensing inductor, and a third switch disposed between the first sensing inductor and the second sensing inductor, and the method may further include: based on the identification that an error occurs in the first LED array based on the identified result, connecting the first sensing inductor, the second sensing inductor, and the second LED array in series by controlling the first switch and the third switch, and based on the identification that an error occurs in the second LED array based on the identified result, connecting the first sensing inductor, the second sensing inductor, and the first LED array in series by controlling the second switch and the third switch.

A plurality of first LEDs included in the first LED array and a plurality of second LEDs included in the second LED array are disposed alternately.

The plurality of LED arrays, the sensing inductor and the auxiliary inductor corresponding to each of the plurality of LED arrays, and the variable resistance are included in an LED circuit, and a resistance value of the LED circuit may be adjusted according to the adjustment of the resistance value of the variable resistance.

The adjusting may include identifying the number of LED arrays in which an error occurs among the plurality of LED arrays, and adjusting the resistance value of the variable resistance to correspond to the identified number.

According to various example embodiments of the disclosure, it is possible to identify an LED array in which an error or breakdown occurs among the plurality of LED arrays.

If an error occurs in any one LED array among the plurality of LED arrays, a problem of an overcurrent flowing to the remaining LED array may be addressed to reduce a probability of occurring an error in the remaining LED arrays or shortening of the life.

The problem regarding the flow of the overcurrent may be addressed without power loss or generation of heat due to resistance.

Even if an error occurs in any one LED array of the plurality of LED arrays, light emission luminance of the remaining LED arrays may be controlled to minimize and/or reduce distortion of an image.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
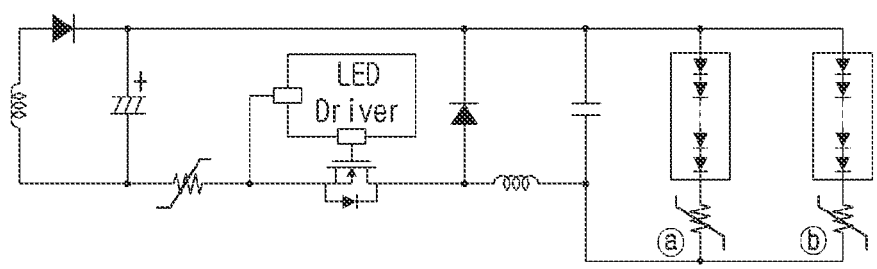
FIG. 1 is a diagram illustrating a method for detecting an error using a resistance according to the related art.

The disclosure will be described in greater detail below after briefly explaining the terms used in the disclosure.

The terms used in describing various example embodiments of the disclosure have been selected as widely used general terms as possible in consideration of functions in the disclosure, but these may vary in accordance with the intention of those skilled in the art, the precedent, the emergence of new technologies and the like. In addition, in a certain case, there may also be an arbitrarily selected term, in which case the meaning will be described in the description of the disclosure. Therefore, the terms used in the disclosure should be defined based on the meanings of the terms themselves and the contents throughout the disclosure, rather than the simple names of the terms.

The example embodiments of the disclosure may be variously changed and include various example embodiments, and specific embodiments will be shown in the drawings and described in detail in the description. However, it should be understood that this is not to limit the scope of the specific embodiments and all modifications, equivalents, and/or alternatives included in the disclosed spirit and technical scope are included. In describing the disclosure, a detailed description of the related art may be omitted when it is determined that the detailed description may unnecessarily obscure a gist of the disclosure.

The terms "first," "second," or the like may be used for describing various elements but the elements may not be limited by the terms. The terms are used only to distinguish one element from another.

Unless otherwise defined specifically, a singular expression may encompass a plural expression. It is to be understood that the terms such as "comprise" or "consist of" are used herein to designate a presence of characteristic, number, step, operation, element, part, or a combination thereof, and not to preclude a presence or a possibility of adding one or more of other characteristics, numbers, steps, operations, elements, parts or a combination thereof.

A term such as "module" or a "unit" in the disclosure may perform at least one function or operation, and may be implemented as hardware, software, or a combination of hardware and software. Further, except for when each of a plurality of "modules", "units", and the like needs to be realized in an individual hardware, the components may be integrated in at least one module and be implemented in at least one processor (not illustrated).

Hereinafter, with reference to the accompanying drawings, various example embodiments of the disclosure will be described in greater detail for those skilled in the art to easily practice the embodiments. But, the disclosure may be implemented in various different forms and is not limited to the embodiments described herein. In addition, in the drawings, the parts not relating to the description are omitted for clearly describing the disclosure, and the same reference numerals are used for the same parts throughout the specification.

FIG. 1 is a diagram illustrating a method for detecting an error using a resistance according to the related art.

Along with an increase in size of electronic apparatuses and output of high-luminance contents, an electronic apparatus may include a plurality of LED arrays. Herein, each of the plurality of LED arrays may be connected in series or parallel.

Referring to FIG. 1, the electronic apparatus may include a plurality of LED arrays connected in parallel and it is assumed that a breakdown occurs in at least one LED array among the plurality of LED arrays, while the electronic apparatus operates. Meanwhile, the LED array may be referred to as an LED bar or LED string including at least one LED element, but hereinafter, these will be collectively referred to as the LED array for convenience of description.

Herein, the breakdown of the LED array may refer to an open state in which no current flows to the LED array due to a failure of an LED element included in the LED array, a damage on a circuit including the LED array, and the like. The breakdown may refer to an error, a fail, or the like and hereinafter, these will be collectively referred to as the error for convenience of description.

If an error occurs in any one LED array among the plurality of LED arrays, a current may not flow to the LED array in which the error occurs and the current converges on the remaining LED arrays, that is, an overcurrent flows, due to the characteristic of the parallel connection. There is a problem that a probability of occurring an error (breakdown) also in the remaining LED arrays increases due to the flow of the overcurrent to the remaining LED arrays.

Referring to FIG. 1, in the electronic apparatus, each of the plurality of LED arrays include a variable resistance connected in series, and the LED array in which the error occurs may be identified by the variable resistance or a resistance value of the variable resistance may be increased to prevent or reduce the flow of the overcurrent to the remaining LED arrays except for the LED array in which the error occurs.

However, in this case, there is a problem of power loss and generation of heat due to the variable resistance. For example, if the resistance value of the variable resistance is 2.4Ω and 700 mA is applied to the variable resistance, the power loss of 1.176 W (0.72*2.4) may occur due to the variable resistance. The specific number herein is an example for convenience of description and may be changed depending on the configuration of circuit and the like.

The electronic apparatus according to various embodiments of the disclosure may identify an LED array in which an error occurs using an inductor instead of the resistance, reduce a probability of occurrence of additional error in the remaining LED arrays in which no error occurs, by preventing and/or reducing the flow of the overcurrent to the LED circuit configuring the electronic apparatus, and minimize and/or reduce power loss and generation of heat due to variable resistance and the like.

Figure 2:
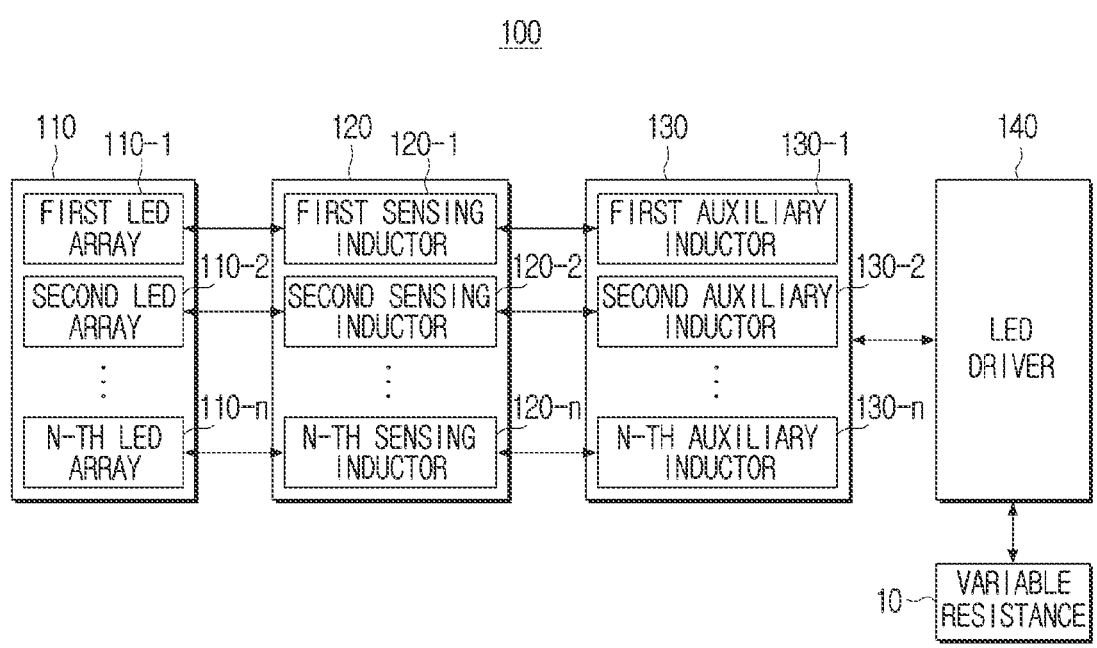
FIG. 2 is a block diagram illustrating an example configuration of an electronic apparatus according to various embodiments.

FIG. 2 is a block diagram illustrating an example configuration of an electronic apparatus according to various embodiments.

An electronic apparatus 100 according to an embodiment of the disclosure may be implemented as a TV, but there is no limitation thereto, and may be applied without limitation, as long as it is an apparatus having a display function such as a smartphone, a table PC, a notebook PC, a head mounted display (HMD), a near eye display (NED), a large format display (LFD), a digital signage, a digital information display (DID), a video wall, a projector display, and the like.

The electronic apparatus 100 according to an embodiment of the disclosure may include a display implemented in various forms such as a liquid crystal display (LCD), an organic light-emitting diode (OLED), a Liquid Crystal on Silicon (LCoS), a Digital Light Processing (DLP), a quantum dot (QD) a display panel, quantum dot light-emitting diodes (QLED) Micro light-emitting diodes (μLED), Mini LED, and the like and the display may include a plurality of LED arrays 110.

The plurality of LED arrays 110 may include a first LED array 110-1, a second LED array 110-2, . . . , and an n-th LED array 110-*n*, and each of the plurality of LED arrays 110 may include a plurality of LED elements. The LED array may be referred to as an LED bar, an LED string, an LED channel, and the like, but may be collectively referred to as the LED array for convenience of description. Meanwhile, the LED element included in the LED array may be implemented as various types of light emitting elements.

The electronic apparatus 100 according to an embodiment of the disclosure may include a first sensing inductor 120-1, 120-2 to an n-th sensing inductor 120-*n* connected in series to the plurality of LED arrays 110, respectively.

In addition, the electronic apparatus 100 may include a first auxiliary inductor 130-1, 130-2 to an n-th auxiliary inductor 130-*n* disposed adjacent to the first sensing inductor 120-1 to the n-the sensing inductor 120-*n*, respectively. This will be described in detail with reference to FIG. 3.

Figure 3:
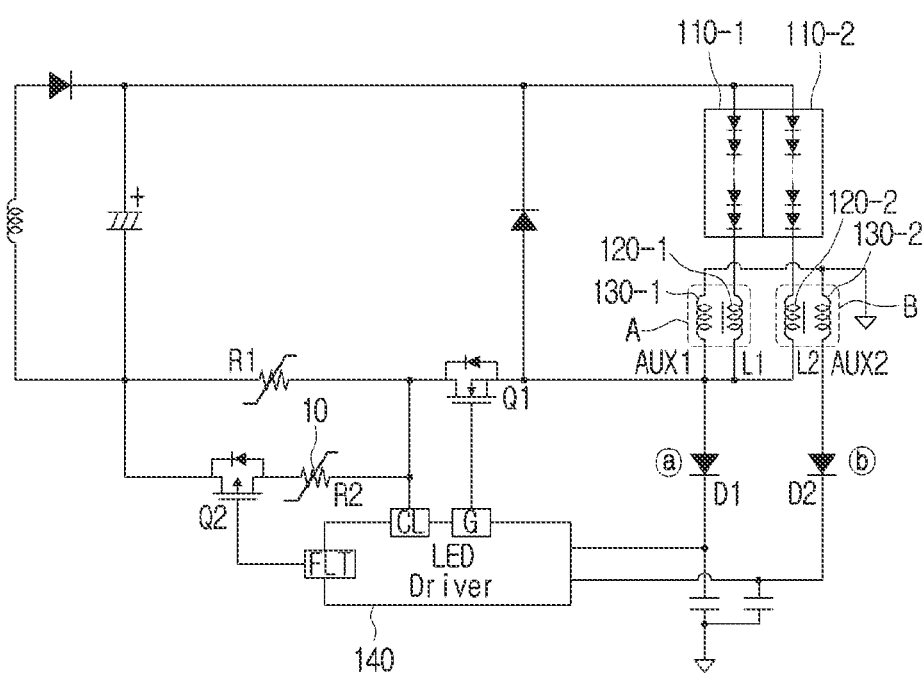
FIG. 3 is a circuit diagram illustrating an example method for detecting an error using an inductor according to various embodiments.

FIG. 3 is a diagram illustrating an example method for detecting an error using an inductor according to various embodiments.

Referring to FIG. 3, the electronic apparatus 100 may include the first LED array 110-1, the first sensing inductor 120-1 connected to the first LED array 110-1 in series, and the first auxiliary inductor 130-1 disposed adjacent to the first sensing inductor 120-1.

In the same manner as the above configuration, the electronic apparatus 100 may include a second LED array 110-2, a second sensing inductor 120-2 connected to the second LED array 110-2 in series, and a second auxiliary inductor 130-2 disposed adjacent to the second sensing inductor 120-2.

The sensing inductor 120 and the auxiliary inductor 130 may refer to an inductor or a coil, and for convenience of description, the inductors connected to the LED arrays 110 in series will be collectively referred to as the sensing inductor 120, and the inductors disposed adjacent to the sensing inductors 130 will be collectively referred to as the auxiliary inductor 130.

The auxiliary inductor 130 that is disposed adjacent to the sensing inductor 120 may indicate that the sensing inductor 120 is a primary winding and the auxiliary inductor 130 is a secondary winding disposed adjacent to the primary winding, and an induced voltage (induced electromotive force) generated on (or applied to) the auxiliary inductor 130 by the sensing inductor 120 may relate to a turns ratio of the primary winding to the secondary winding. A ratio of a voltage applied to the sensing inductor 120 to an induced voltage of the auxiliary inductor 130 may be the same as the turns ratio.

For example, when a voltage is applied to the sensing inductor 120, an induced voltage is generated on the auxiliary inductor 130, and a ratio of a voltage V1 of the sensing inductor 120 to an induced voltage V2 of the auxiliary inductor 130 may be the same as a turns ratio, that is, a ratio of a number N1 of turns of coil of the sensing inductor 120 to a number N2 of turns of coil of the auxiliary inductor 130 (V1/V2=N1/N2).

Each of a first induced voltage generated on the first auxiliary inductor 130-1 and a second induced voltage generated on the second auxiliary inductor 130-2 may be rectified/smoothed by diodes D1 and D2 illustrated in FIG. 3 and input to an LED driver 140.

Referring back to FIG. 2, the LED driver 140 may drive the display. For example, the LED driver 140 may control light emission of the LED light emitting element or a degree of light emission thereof by applying a driving voltage or flowing a driving current to the plurality of LED arrays 110 that configures the display according to the control of a controller (not illustrated).

The LED driver 140 according to an embodiment may include various circuitry to adjust supply time or intensity of the driving current supplied to each of the plurality of LED arrays 110 to correspond to an input image signal.

According to an embodiment of the disclosure, the LED driver 140 may identify whether an error occurs on the plurality of LED arrays 110 based on the induced voltage input from the auxiliary inductor 130.

In an example, the LED driver 140 may identify whether an error occurs in at least one of the first LED array 110-1 or the second LED array 110-2 based on a first induced voltage generated on the first auxiliary inductor 130-1 and a second induced voltage generated on the second auxiliary inductor 130-2. This will be described in greater detail below with reference to FIG. 3.

Referring to FIG. 3, when each of the first induced voltage sensed in the first auxiliary inductor 130-1 and the second induced voltage sensed in the second auxiliary inductor 130-2 is rectified/flattened through the diodes D1 and D2 illustrated in FIG. 3 and input, the LED driver 140 may identify whether an error occurs in at least one of the first LED array 110-1 or the second LED array 110-2 based on the input voltage. The first induced voltage sensed by the first auxiliary inductor 130-1 may refer to the first induced voltage generated on the first auxiliary inductor 130-1 or applied to the first auxiliary inductor 130-1. In addition, the second induced voltage sensed by the second auxiliary inductor 130-2 may refer to the second induced voltage generated on the second auxiliary inductor 130-2 or applied to the second auxiliary inductor 130-2.

In an example, if at least one of the first induced voltage or the second induced voltage is a threshold voltage or more, the LED driver 140 may identify that an error occurs in at least one of the first LED array 110-1 or the second LED array 110-2.

For example, it is assumed that an error occurs in the first LED array 110-1 and the first LED array 110-1 is in an open state. In this case, due to the characteristic of the parallel connection, no current flows to the first LED array 110-1 and an overcurrent flows to the second LED array 110-2.

In addition, the first induced voltage generated on the first auxiliary inductor 130-1 may be 0 [V] or close to 0 [V], and the second induced voltage generated on the second auxiliary inductor 130-2 may be a threshold voltage or more.

In an example, it is assumed that an error occurs in the second LED array 110-2 and the second LED array 110-2 is in an open state. In this case, according to the characteristic of the parallel connection, no current flows to the second LED array 110-2 and the overcurrent flows to the first LED array 110-1. The first induced voltage generated on the first auxiliary inductor 130-1 may be the threshold voltage or more and the second induced voltage generated on the second auxiliary inductor 130-2 may be 0 [V] or close to 0 [V].

The threshold voltage corresponding to the first induced voltage may be determined based on a turns ratio according to the number of turns of the first sensing inductor 120-1 to the number of turns of the first auxiliary inductor 130-1, and the threshold voltage corresponding to the second induced voltage may be determined based on a turns ratio according to the number of turns of the second sensing inductor 120-2 to the number of turns of the second auxiliary inductor 130-2. If the turns ratio is the same, the threshold voltage corresponding to the first induced voltage may be the same as the threshold voltage corresponding to the second induced voltage.

If at least one of the first induced voltage or the second induced voltage is the threshold voltage or more, the LED driver 140 according to an embodiment may identify that an error occurs in at least one of the plurality of LED arrays 110.

To prevent and/or reduce the overcurrent flowing to the remaining LED arrays in which no error occurs, the LED driver 140 may adjust the entire resistance of the LED circuit. The LED circuit may include the plurality of LED arrays 110, the sensing inductors 120 and the auxiliary inductors 130 respectively corresponding to the plurality of LED arrays, and the variable resistance 10, and the LED driver 140 may adjust the entire resistance of the LED circuit by adjusting the resistance value of the variable resistance 10 (R2 of FIG. 3). For example, the LED driver 140 may prevent and/or reduce the overcurrent flowing to the remaining LED array in which no error occurs by increasing the resistance value of the variable resistance 10. In other words, the amount of current flowing to the LED array may be determined according to the resistance value of the variable resistance 10. In an example, if the resistance value of the variable resistance 10 increases, the amount of current flowing to the LED array may decrease, and if the resistance value of the variable resistance 10 decreases, the amount of current flowing to the LED array may increase.

This will be described in greater detail below with reference to FIGS. 4A, 4B and 4C.

Figure 4A:
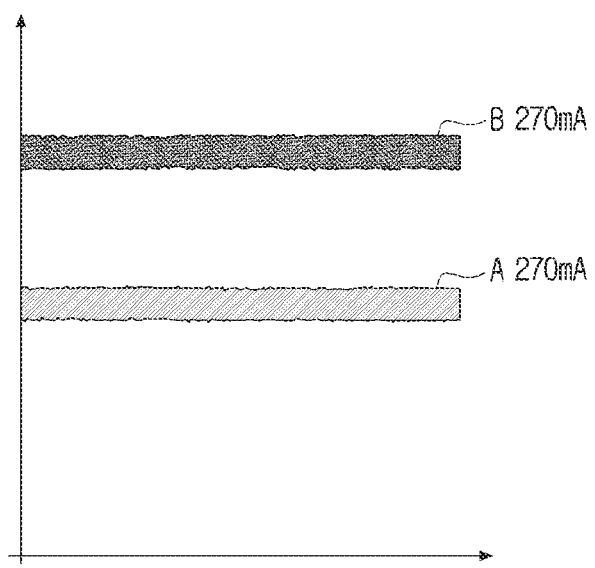
FIGS. 4A, 4B, and 4C are diagrams illustrating an example in which an error occurs in an LED array according to various embodiments.
Figure 4A:
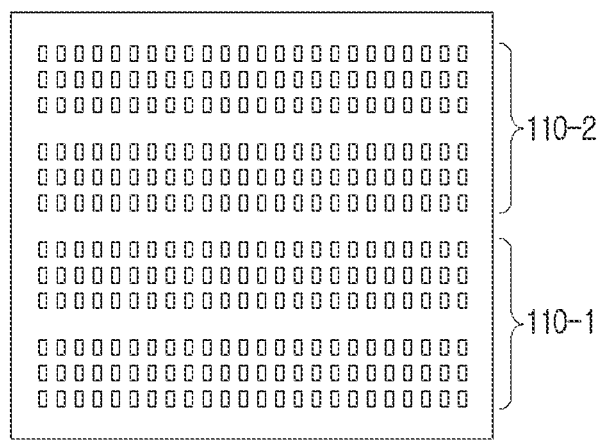
Figure 4B:
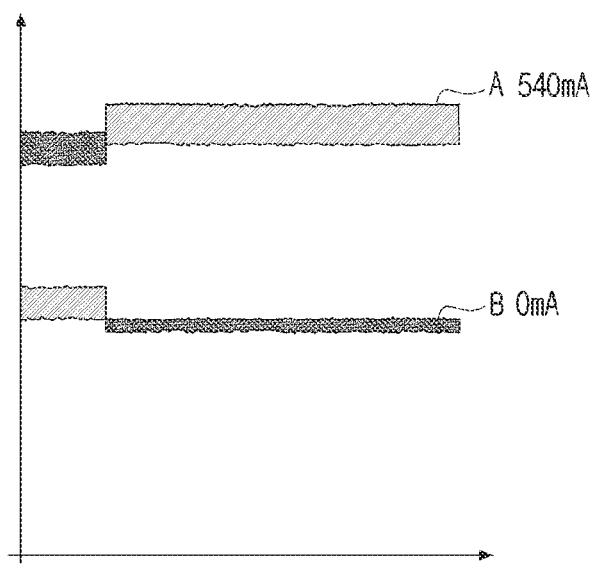
Figure 4B:
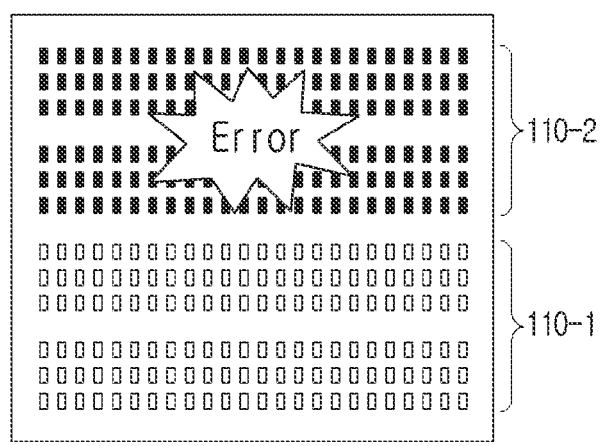
Figure 4C:
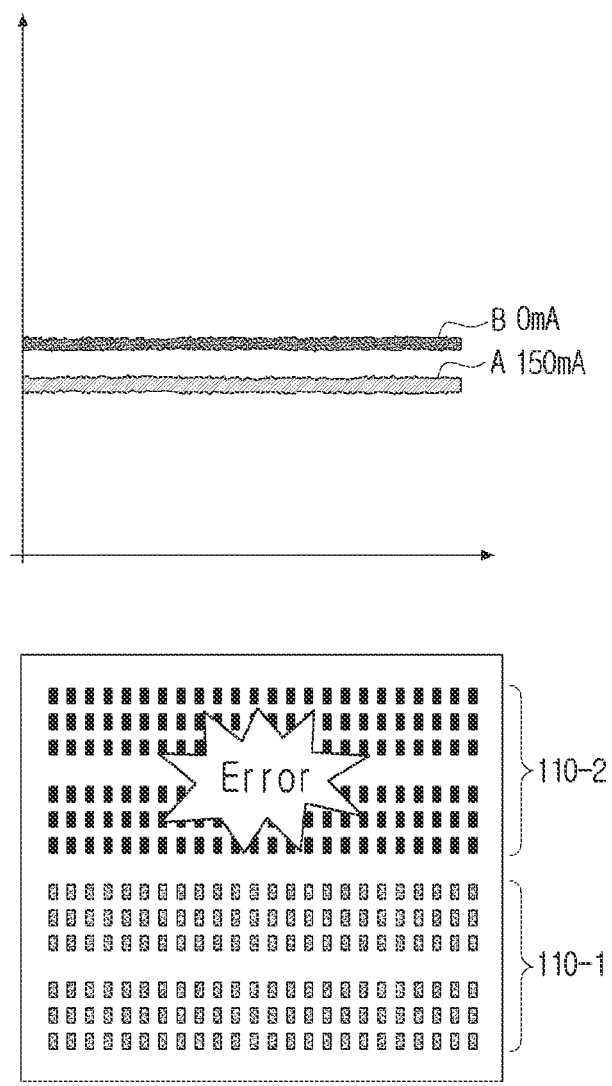

FIGS. 4A, 4B, and 4C are diagrams illustrating an example where it is identified that an error occurs in an LED array according to various embodiments.

In FIGS. 4A, 4B and 4C, A (or A_CH) represents the first LED array 110-1 and B (or B_CH) represents the second LED array 110-2.

Referring to FIG. 4A, it is assumed that both the first LED array 110-1 and the second LED array 110-2 are normally operated and the same size of current is applied to the first LED array 110-1 and the second LED array 110-2.

If each of the plurality of LED arrays 110 is normally operated, the size of the current flowing to each of the plurality of LED arrays 110 may be the same.

Referring to FIG. 4A, both the first LED array 110-1 and the second LED array 110-2 may emit light normally and the current flowing to the first LED array 110-1 and the current flowing to the second LED array 110-2 may be the same which is 270 mA. The specific number herein is merely an example for convenience of description and may be changed according to the circuit configuration or the characteristic of the LED element.

Referring to FIG. 4B, for example, it is assumed that an error occurs in the second LED array 110-2.

In this case, since the second LED array 110-2 is in an open state, the current flowing to the second LED array 110-2 is 0 [A] and the current that flowed to each of the first LED array 110-1 and the second LED array 110-2 flows only to the first LED array 110-1 in which no error occurs.

Referring to the graph of FIG. 4B, the overcurrent of 540 mA flows to the first LED array 110-1 and the current of approximately 0 A flows to the second LED array 110-2. If the overcurrent flows to the first LED array 110-1, the first LED array 110-1 excessively emits light. Since the overcurrent continuously flows to the first LED array 110-1, the error may occur also in the first LED array 110-1 or a problem of life shortening of the LED elements included in the first LED array 110-1 may occur.

The LED driver 140 according to an embodiment of the disclosure may identify whether the error occurs in at least one of the plurality of LED arrays 110 based on the first and second induced voltages received from the first auxiliary inductor 130-1 and the second auxiliary inductor 130-2, and increase the resistance value of the variable resistance 10 based on the identification result so that the overcurrent does not flow to the remaining LED array.

In an example, if the error occurs in the second LED array 110-2, a voltage input from the first auxiliary inductor 130-1 related to the first LED array 110-1 may be the threshold voltage or more, and a voltage input from the second auxiliary inductor 130-2 related to the second LED array 110-2 may be close to 0 [V]. The LED driver 140 according to an embodiment may identify that the plurality of LED arrays 110 do not correspond to the normal state and increase the resistance value of the variable resistance 10.

Referring to FIG. 4C, the LED driver 140 may increase the resistance value of the variable resistance 10, increase the resistance value of the LED circuit, and reduce the size of the current flowing to the first LED array 110-1 in which no error occurs from 540 mA to 150 mA.

In order to prevent and/or reduce the overcurrent flowing due to the convergence of the current on the LED array 110 in which no error occurs as described above, it is possible to reduce a probability of occurrence of the error in the corresponding LED array 110 and reduce a speed of the life shortening of the LED elements included in the corresponding LED array 110.

Figure 5:
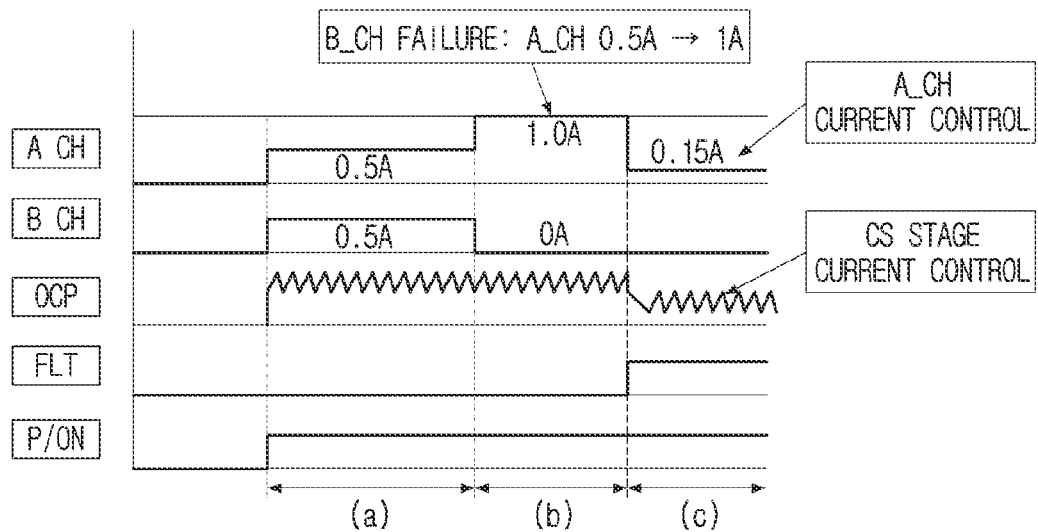
FIG. 5 is a diagram illustrating an example change of current applied to each of a plurality of LED arrays according to various embodiments.

A graph of FIGS. 4A, 4B and 4C expressed according to the elapse of time is as illustrated in FIG. 5.

FIG. 5 is a graph illustrating an example change of current applied to each of a plurality of LED arrays according to various embodiments.

A section (a) in the graph of FIG. 5 corresponds to FIG. 4A.

According to an embodiment, if each of the first LED array 110-1 and the second LED array 110-2 is normally operated, the same size of the current (e.g., 0.5 A) may flow to each of the first LED array 110-1 and the second LED array 110-2 of FIG. 5.

It is assumed that the error occurs in at least one LED array of the plurality of LED arrays 110 during the operation of the electronic apparatus 100. In FIG. 5, A_CH represents the first LED array 110-1 and B_CH represents the second LED array 110-2.

A section (b) in the graph of FIG. 5 corresponds to FIG. 4B.

No current flows to the second LED array 110-2 in the open state due to the occurrence of the error and the overcurrent (e.g., 1 A) flows to the first sled array 110-1. In this case, the LED driver 140 may adjust the size of the variable resistance 10 based on the first induced voltage generated on the first auxiliary inductor 130-1 disposed adjacent to the first sensing inductor 120-1 connected to the first LED array 110-1 in series.

Referring to FIG. 3, if it is identified that the error occurs in at least one LED array among the plurality of LED arrays 110 based on the first induced voltage generated on the first auxiliary inductor 130-1, the LED driver 140 may generate an FLT signal to increase the resistance value of the variable resistance 10. The FLT signal may include a fault signal which may represent that the LED circuit (or LED array) is abnormal (the plurality of LED arrays 110 do not correspond to the normal state).

In addition, in order to prevent and/or reduce the overcurrent flowing to the plurality of LED arrays 110, the LED driver 140 may implement over current protection (OCP) to prevent and/or reduce the flow of the overcurrent due to the convergence of the current of the remaining LED arrays according to the occurrence of the error in at least one LED array.

According to an embodiment of the disclosure, the LED driver 140 may increase the resistance value of the variable resistance 10 to reduce the size of the current flowing to the LED circuit. A section (c) in the graph of FIG. 5 corresponds to FIG. 4C.

It is advantageous that the resistance value of the variable resistance 10 is increased so that the size of the current flowing to the LED circuit, that is, the LED arrays in which no error occurs, from 1 A to 0.15 A, thereby preventing and/or avoiding a situation in which the error occurs due to the continuous flow of the overcurrent to the remaining LED arrays in which no error occurs, in advance.

In other words, the resistance value of the LED circuit may be adjusted according to the adjustment of the resistance value of the variable resistance 10, and size of the current flowing to the remaining LED array in which no error occurs may be adjusted according to the adjustment of the resistance value of the LED circuit.

Figure 6:
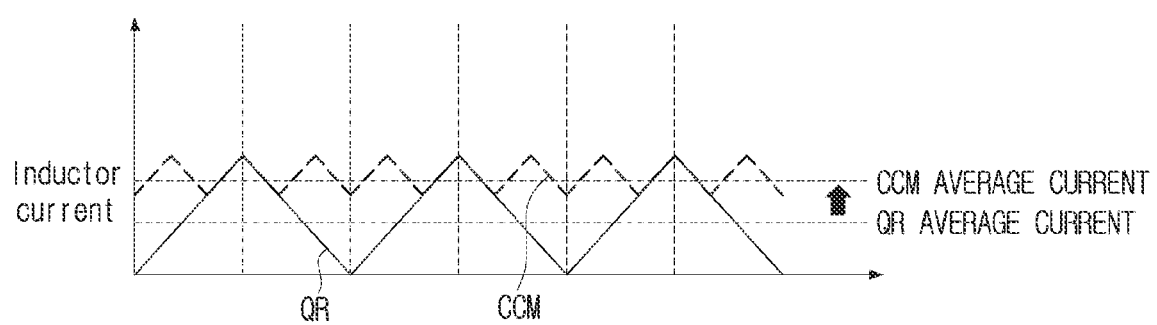
FIG. 6 is a graph illustrating a QR mode and a CCM mode according to various embodiments.

FIG. 6 is a graph illustrating a QR mode and a CCM mode according to various embodiments.

The LED driver 140 according to an embodiment of the disclosure may supply a power to the first LED array 110-1 and the second LED array 110-2 in a quasi-resonant (QR) mode (or pseudo resonant mode). For example, a power supply provided in the electronic apparatus 100 may include a PFC circuit. The PFC circuit may be implemented as various types of converters such as buck, boost, buck-boost converter, and the like.

An operation mode may be divided into Quasi-resonant (QR), Continuous Conduction Mode (CCM), Critical Conduction Mode (CrM), and Discontinuous Conduction Mode (DCM) according to the current wavelength of the inductor provided in the PFC circuit.

The QR mode herein may be a mode for supplying a power by operating the converter in a boundary of a continuous conduction mode/discontinuous conduction mode (CCM/DCM, continuous and discontinuous conduction mode).

For example, referring to FIG. 6, the LED driver 140 may linearly increase the inductor current and linearly reduce the current from a peak current to zero. The PFC circuit capable of zero current switching in the QR mode may turn on the switch element, when the inductor current is 0, to reduce MOSFET turn-on switching loss, thereby reducing electromagnetic interference (EMI) and increasing power conversion efficiency. However, an average current flowing to the LED circuit in the QR mode is relatively smaller than an average current in the CCM mode which will be described below.

If it is identified that the error occurs in any one of the first LED array 110-1 or the second LED array 110-2, the LED driver 140 according to an embodiment of the disclosure may convert the power supply mode from the QR mode to the continuous current mode (CCM).

The PFC circuit operating in the CCM mode may include a circuit which maintains continuous properties so that the inductor current does not become 0. An average current flowing to the LED circuit in the CCM mode is relatively greater than the average current flowing to the LED circuit in the QR mode.

Referring to FIG. 4B, if the error occurs in at least one array of the plurality of LED arrays 110, the entire luminance of the display may decrease. Along with a decrease of maximum luminance that the display is able to output, there is a problem of darkening of the entire screen and occurrence of distortion when outputting a high-luminance content.

If it is identified that the error occurs in at least one LED array among the plurality of LED arrays 110, the LED driver 140 according to an embodiment of the disclosure may convert the operation mode of the PFC circuit from the QR mode to the CCM mode so that the average current flowing to the remaining LED arrays increases.

The LED driver 140 according to an embodiment may control light sources included in the remaining LED arrays, in which the error does not occur, by pulse width modulation (PWM) in which a duty ratio changes, or may control the luminance of light sources by changing intensity of current flowing to the remaining LED arrays. The pulse width modulation (PWM) may control a ratio of turning on and off of the light sources, and the duty ratio (%) thereof may be determined according to a dimming value input from the LED driver 140.

For example, if it is identified that the error occurs in at least one LED array among the plurality of LED arrays 110, the LED driver 140 may increase the duty ratio to increase the luminance of the light sources included in the remaining LED arrays in which the error does not occurs.

By doing so, it is possible to minimize and/or reduce the darkening problem of the screen and distortion problem of a high-luminance content due to some LED arrays (LED arrays in which the error occurs) which do not operate.

Figure 7:
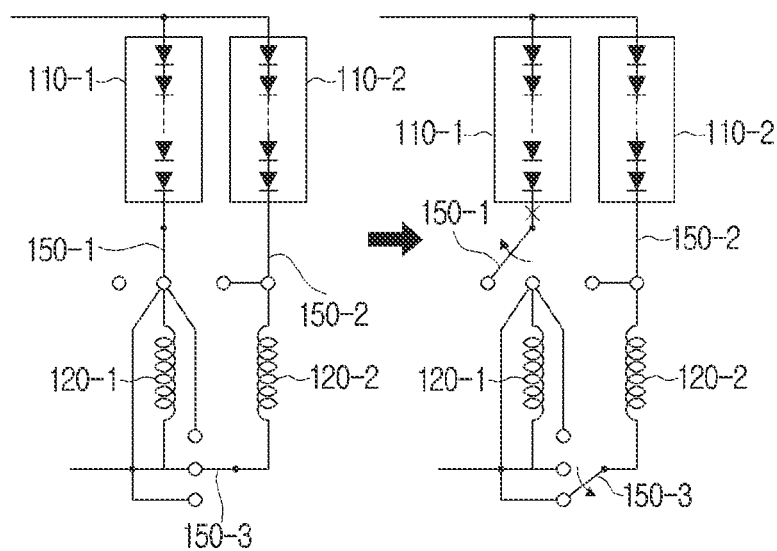
FIG. 7 is a diagram illustrating an example switch operation according to various embodiments.

FIG. 7 is a diagram illustrating an example switch operation according to various embodiments.

The LED circuit according to an embodiment of the disclosure may include a first switch 150-1 disposed between the first LED array 110-1 and the first sensing inductor 120-1, a second switch 150-2 disposed between the second LED array 110-2 and the second sensing inductor 120-2, and a third switch 150-3 disposed between the first sensing inductor 110-1 and the second sensing inductor 120-2.

According to an embodiment of the disclosure, it is assumed that the error occurs in the first LED array 110-1. In this case, the current does not flow to the first sensing inductor 120-1 that is connected to the first LED array 110-1 in series.

The LED driver 140 according to an embodiment of the disclosure may control the first switch 150-1, the second switch 150-2, and the third switch 150-3 to connect the first sensing inductor 120-1 and the second sensing inductor 120-2 in series.

Referring to FIG. 7, the LED driver 140 may open the first switch 150-1 and control the third switch 150-3 to connect a lower end of the second sensing inductor 120-2 and an upper end of the first sensing inductor 120-1 in series. Therefore, if the error occurs in the first LED array 110-1, the LED driver 140 may connect the first sensing inductor 120-1, the second sensing inductor 120-2, and the second LED array 110-2 in series.

Figure 8:
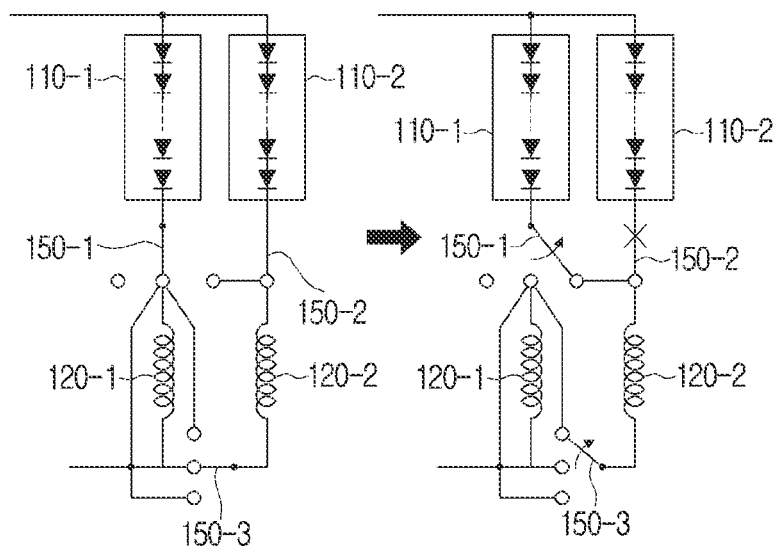
FIG. 8 is a diagram illustrating an example switch operation according to various embodiments.

FIG. 8 is a diagram illustrating a switch operation according to various embodiments.

According to an embodiment of the disclosure, it is assumed that the error occurs in the second LED array 110-2. In this case, the current does not flow to the second sensing inductor 120-2 connected to the second LED array 110-2 in series.

The LED driver 140 according to an embodiment of the disclosure may control the first switch 150-1, the second switch 150-2, and the third switch 150-3 to connect the first sensing inductor 120-1 and the second sensing inductor 120-2 in series.

Referring to FIG. 8, the LED driver 140 may control the first switch 150-1 to connect a lower end of the first LED array 110-1 and an upper end of the second sensing inductor 120-2 in series, and control the third switch 150-3 to connect the lower end of the second sensing inductor 120-2 and the upper end of the first sensing inductor 120-1 in series. Therefore, if the error occurs in the second LED array 110-2, the LED driver 140 may connect the first sensing inductor 120-1, the second sensing inductor 120-2, and the first LED array 110-1 in series.

According to various example embodiments illustrated in FIGS. 7 and 8, since the first sensing inductor 120-1 and the second sensing inductor 120-2 are connected in series, a size L of the inductor may be a sum of a size L1 of the first sensing inductor 120-1 and a size L2 of the second sensing inductor 120-2, that is, L1+L2.

Figure 9:
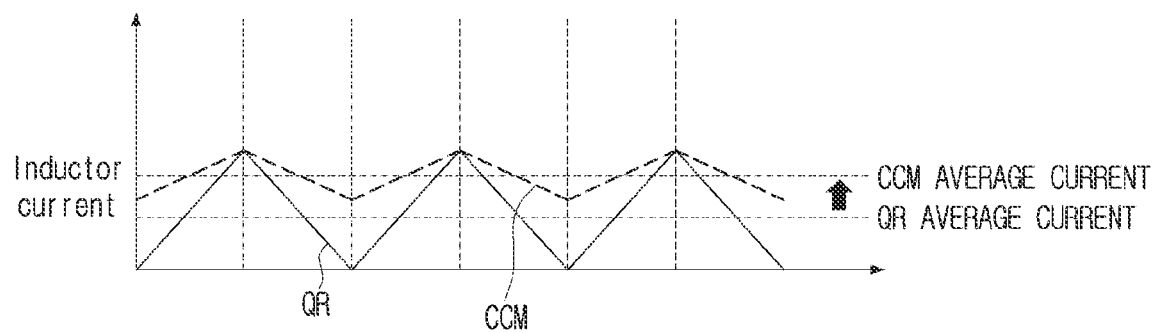
FIG. 9 is a graph illustrating a QR mode and a CCM mode according to various embodiments.

FIG. 9 is a graph illustrating the QR mode and the CCM mode according to various embodiments.

FIG. 9 illustrates an intensity of an average current flowing to the LED circuit in the CCM mode and a change of the current in consideration of the size L (L1+L2) of the inductor, since the first sensing inductor 120-1 and the second sensing inductor 120-2 are connected in series.

Referring back to FIG. 2, according to an embodiment of the disclosure, the plurality of first LEDs included in the first LED array 110-1 and the plurality of second LEDs included in the second LED array 110-2 may be disposed alternately.

According to an embodiment, the display may be implemented as an edge type display, and the plurality of first LEDs and the plurality of second LEDs included in a backlight may be disposed alternately.

In this case, even if the error occurs in the first LED array 110-1, the second LEDs located between the plurality of first LEDs included in the first LED array 110-1 may operate normally, and accordingly, the problem such as darkening of one area of the display or outputting one area of the screen in black may not occur.

In another example, the display may be implemented as a direct type display, the first LED array 110-1 may include first to n-th LED lines, and the second LED array 110-2 may include first to n-th LED lines.

According to an embodiment, the LED lines included in the first LED array 110-1 and the LED lines included in the second LED array 110-2 may be disposed alternately.

In this case, even if the error occurs in the first LED array 110-1, the plurality of LED lines that are located between the plurality of LED lines included in the first LED array 110-1 and included in the second LED array 110-2 may operate normally, and accordingly, the problem such as darkening of one area of the display or outputting one area of the screen in black may not occur.

The LED driver 140 according to an embodiment of the disclosure may identify the number of LED arrays in which the error occurs among the plurality of LED arrays 110. Then, the LED driver 140 may adjust a resistance value of the variable resistance 10 to correspond to the identified number.

For example, the LED driver 140 may increase the resistance value of the variable resistance 10, as the number of LED arrays in which the error occurs increases, thereby preventing and/or reducing the overcurrent flowing to the remaining LED arrays in which the error does not occur.

According to an embodiment, information on the resistance value of the variable resistance 10 corresponding to the number of LED arrays in which the error occurs may be stored in the electronic apparatus 100 in advance, and in another example, the LED driver 140 may sequentially increase the resistance value of the variable resistance 10 and may not increase the resistance value of the variable resistance 10, if the intensity of the current flowing to the remaining LED arrays in which the error does not occur is less than a threshold current (e.g., less than the overcurrent).

Figure 10:
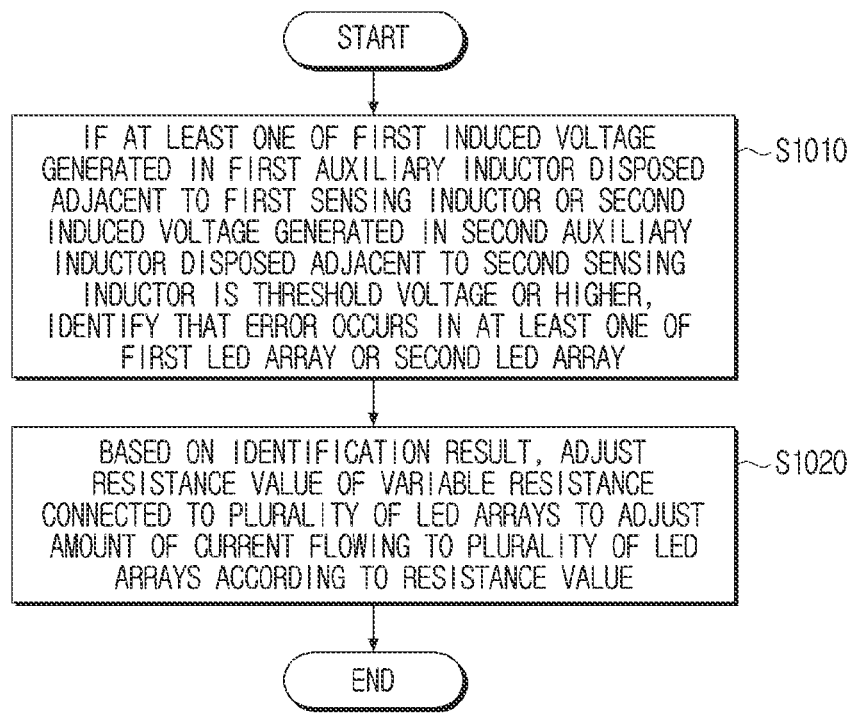
FIG. 10 is a flowchart illustrating an example method of controlling the electronic apparatus according to various embodiments.

FIG. 10 is a flowchart illustrating an example method of controlling the electronic apparatus according to various embodiments.

According to an embodiment of the disclosure, in a method for controlling an electronic apparatus including a plurality of LED arrays disposed in parallel, a first sensing inductor connected to a first LED array among the plurality of LED arrays in series, and a second sensing inductor connected to a second LED array in series, it is identified whether an error occurs in at least one of the first LED array or the second LED array based on a first induced voltage generated on a first auxiliary inductor disposed adjacent to the first sensing inductor and a second induced voltage generated on a second auxiliary inductor disposed adjacent to the second sensing inductor (S1010).

A resistance value of a variable resistance which is connected to the plurality of LED arrays and adjusts a current amount flowing to the plurality of LED arrays according to the resistance value may be adjusted based on the identified result (S1020).

The identification operation S1010 may include, based on at least one of the first induced voltage or the second induced voltage being a threshold voltage or more, identifying that an error occurs in at least one of the first LED array or the second LED array, and the adjustment operation S1020 may include increasing the resistance value of the variable resistance.

According to an embodiment of the disclosure, each of the first sensing inductor and the second sensing inductor is a primary coil, and each of the first auxiliary inductor and the second auxiliary inductor is a secondary coil disposed adjacent to the primary coil.

A threshold voltage corresponding to the first induced voltage may be determined based on a turns ratio according to the number of turns of the first sensing inductor to the number of turns of the first auxiliary inductor, the second sensing inductor and the second auxiliary inductor may correspond to the primary coil and the secondary coil disposed adjacent to the primary coil, and a threshold voltage corresponding to the second induced voltage may be determined based on a turns ratio according to the number of turns of the second sensing inductor to the number of turns of the second auxiliary inductor.

The adjustment operation S1020 may include, based on the identification that an error occurs in any one of the first LED array or the second LED array, adjusting a voltage applied to the other one of the first LED array or the second LED array to be less than the threshold voltage by increasing the resistance value of the variable resistance.

The method according to an embodiment of the disclosure may further include, based on the identification that an error occurs in any one of the first LED array or the second LED array based on the identified result, converting a power supply mode for the other one of the first LED array or the second LED array from a quasi-resonant (QR) mode to a continuous current mode (CCM).

The method may further include increasing a duty ratio of a pulse width modulation (PWM) current applied to the other one of the first LED array or the second LED array in the CCM mode.

An electronic apparatus according to an embodiment may further include: a first switch disposed between the first LED array and the first sensing inductor, a second switch disposed between the second LED array and the second sensing inductor, and a third switch disposed between the first sensing inductor and the second sensing inductor, and the method according to an embodiment may further include: based on the identification that an error occurs in the first LED array based on the identified result, connecting the first sensing inductor, the second sensing inductor, and the second LED array in series by controlling the first switch and the third switch, and based on the identification that an error occurs in the second LED array based on the identified result, connecting the first sensing inductor, the second sensing inductor, and the first LED array in series by controlling the second switch and the third switch.

According to an embodiment, a plurality of first LEDs included in the first LED array and a plurality of second LEDs included in the second LED array may be disposed alternately.

According to an embodiment of the disclosure, the plurality of LED arrays, the sensing inductor and the auxiliary inductor corresponding to each of the plurality of LED arrays, and the variable resistance are included in the LED circuit, and a resistance value of the LED circuit may be adjusted according to the adjustment of the resistance value of the variable resistance.

According to an embodiment, the adjustment operation S1020 may include identifying the number of LED arrays in which an error occurs among the plurality of LED arrays, and adjusting the resistance value of the variable resistance to correspond to the identified number.

However, various embodiments of the disclosure may also be applied to all types of electronic apparatuses including a display, in addition to the above electronic apparatus.

The example embodiments described above may be implemented in a recording medium readable by a computer or a similar device using software, hardware, or a combination thereof. In some cases, the embodiments described in this disclosure may be implemented as a processor itself. According to the implementation in terms of software, the embodiments such as procedures and functions described in this specification may be implemented as separate software modules. Each of the software modules may perform one or more functions and operations described in this specification.

Computer instructions for executing processing operations of the electronic apparatus 100 according to various embodiments of the disclosure descried above may be stored in a non-transitory computer-readable medium. When the computer instructions stored in such a non-transitory computer-readable medium are executed by the processor of a specific machine, the computer instructions of the electronic apparatus 100 according to various embodiments described above may be executed by the specific machine.

The non-transitory computer-readable medium may refer to a medium that semi-permanently stores data and is readable by a machine. Examples of the non-transitory computer-readable medium may include a CD, a DVD, a hard disk drive, a Blu-ray disc, a USB, a memory card, and a ROM.

While the disclosure has been illustrated and described with reference to various example embodiments, it will be understood that the various example embodiments are intended to be illustrative, not limiting. It will be further understood by those skilled in the art, that various modifications can be made by, without departing from the gist of the disclosure, including the appended claims. It will be further understood that any of the embodiment(s) described herein may be used in conjunction with any other embodiment(s) described herein.

What is claimed is:

1. An electronic apparatus comprising:
   a plurality of light emitting diode (LED) arrays disposed in parallel;
   a first sensing inductor connected to a first LED array of the plurality of LED arrays in series;
   a first auxiliary inductor disposed adjacent to the first sensing inductor;
   a second sensing inductor connected to a second LED array of the plurality of LED arrays in series;
   a second auxiliary inductor disposed adjacent to the second sensing inductor;
   a variable resistance connected to the plurality of LED arrays and configured to adjust an amount of a current flowing to the plurality of LED arrays according to a resistance value; and
   an LED driver configured to, based on at least one of a first induced voltage generated on the first auxiliary inductor or a second induced voltage generated on the second auxiliary inductor being a threshold voltage or more, identify that an error occurs in at least one of the first LED array or the second LED array, and adjust the resistance value of the variable resistance based on the identified result.

2. The electronic apparatus according to claim 1, wherein the LED driver is configured to, based on the identification that an error occurs in at least one of the first LED array or the second LED array, increase the resistance value of the variable resistance.

3. The electronic apparatus according to claim 2, wherein the first sensing inductor and the second sensing inductor comprise primary coils,
   each of the first auxiliary inductor and the second auxiliary inductor comprise a secondary coil disposed adjacent to a corresponding primary coil,
   a threshold voltage corresponding to the first induced voltage is determined based on a turns ratio of a number of turns of the first sensing inductor to a number of turns of the first auxiliary inductor, and
   a threshold voltage corresponding to the second induced voltage is determined based on a turns ratio of a number of turns of the second sensing inductor to a number of turns of the second auxiliary inductor.

4. The electronic apparatus according to claim 2, wherein the LED driver is configured to, based on the identification that an error occurs in any one of the first LED array or the second LED array, adjust a voltage applied to another one of the first LED array or the second LED array to be less than the threshold voltage by increasing the resistance value of the variable resistance.

5. The electronic apparatus according to claim 1, wherein the LED driver is configured to, based on the identification that an error occurs in any one of the first LED array or the second LED array based on the identified result, convert a power supply mode for another one of the first LED array or the second LED array from a quasi-resonant (QR) mode to a continuous current mode (CCM).

6. The electronic apparatus according to claim 5, wherein the LED driver is configured to increase a duty ratio of a pulse width modulation (PWM) current applied to the other one of the first LED array or the second LED array in the CCM mode.

7. The electronic apparatus according to claim 1, further comprising:
a first switch disposed between the first LED array and the first sensing inductor;
a second switch disposed between the second LED array and the second sensing inductor; and
a third switch disposed between the first sensing inductor and the second sensing inductor,
wherein the LED driver is configured to:
based on the identification that an error occurs in the first LED array based on the identified result, connect the first sensing inductor, the second sensing inductor, and the second LED array in series by controlling the first switch and the third switch, and
based on the identification that an error occurs in the second LED array based on the identified result, connect the first sensing inductor, the second sensing inductor, and the first LED array in series by controlling the second switch and the third switch.

8. The electronic apparatus according to claim 1, wherein a plurality of first LEDs included in the first LED array and a plurality of second LEDs included in the second LED array are disposed alternately.

9. The electronic apparatus according to claim 1, wherein the plurality of LED arrays, the sensing inductor and the auxiliary inductor corresponding to each of the plurality of LED arrays, and the variable resistance are included in an LED circuit, and
a resistance value of the LED circuit is adjusted according to the adjustment of the resistance value of the variable resistance.

10. The electronic apparatus according to claim 1, wherein the LED driver is configured to: identify the number of LED arrays in which an error occurs among the plurality of LED arrays, and
adjust the resistance value of the variable resistance to correspond to the identified number.

11. A method for controlling an electronic apparatus comprising a plurality of light emitting diode (LED) arrays disposed in parallel, a first sensing inductor connected to a first LED array of the plurality of LED arrays in series, and a second sensing inductor connected to a second LED array in series, the method comprising:
based on at least one of a first induced voltage generated on a first auxiliary inductor disposed adjacent to the first sensing inductor or a second induced voltage generated on a second auxiliary inductor disposed adjacent to the second sensing inductor being a threshold voltage or more, identifying that an error occurs in at least one of the first LED array or the second LED array; and
adjusting a resistance value of a variable resistance connected to the plurality of LED arrays and adjusting an amount of a current flowing to the plurality of LED arrays according to the resistance value based on the identified result.

12. The method according to claim 11, wherein the adjusting comprises, based on the identification that an error occurs in at least one of the first LED array or the second LED array, increasing the resistance value of the variable resistance.

13. The method according to claim 12, wherein the first sensing inductor and the second sensing inductor comprise primary coils,
each of the first auxiliary inductor and the second auxiliary inductor comprise a secondary coil disposed adjacent to a corresponding primary coil,
a threshold voltage corresponding to the first induced voltage is determined based on a turns ratio of a number of turns of the first sensing inductor to a number of turns of the first auxiliary inductor, and
a threshold voltage corresponding to the second induced voltage is determined based on a turns ratio of the number of turns of the second sensing inductor to the number of turns of the second auxiliary inductor.

14. The method according to claim 12, wherein the adjusting comprises, based on the identification that an error occurs in any one of the first LED array or the second LED array, adjusting a voltage applied to another one of the first LED array or the second LED array to be less than the threshold voltage by increasing the resistance value of the variable resistance.

15. The method according to claim 11, further comprising:
based on the identification that an error occurs in any one of the first LED array or the second LED array based on the identified result, converting a power supply mode for one of the first LED array or the second LED array from a quasi-resonant (QR) mode to a continuous current mode (CCM).

16. The method according to claim 15, further comprising:
increasing a duty ratio of a pulse width modulation (PWM) current applied to the other one of the first LED array or the second LED array in the CCM mode.

17. The method according to claim 11, further comprising:
a first switch disposed between the first LED array and the first sensing inductor;
a second switch disposed between the second LED array and the second sensing inductor; and
a third switch disposed between the first sensing inductor and the second sensing inductor,
based on the identification that an error occurs in the first LED array based on the identified result, connecting the first sensing inductor, the second sensing inductor, and the second LED array in series by controlling the first switch and the third switch, and
based on the identification that an error occurs in the second LED array based on the identified result, connecting the first sensing inductor, the second sensing inductor, and the first LED array in series by controlling the second switch and the third switch.

18. The method according to claim 11, wherein a plurality of first LEDs included in the first LED array and a plurality of second LEDs included in the second LED array are disposed alternately.

19. The method according to claim 11, wherein the plurality of LED arrays, the sensing inductor and the auxiliary inductor corresponding to each of the plurality of LED arrays, and the variable resistance are included in an LED circuit, and
a resistance value of the LED circuit is adjusted according to the adjustment of the resistance value of the variable resistance.

20. The method according to claim 11, wherein the identifying comprises identifying the number of LED arrays in which an error occurs among the plurality of LED arrays, and wherein the adjusting comprises adjusting the resistance value of the variable resistance to correspond to the identified number.

\* \* \* \* \*